(12) United States Patent
Chen et al.

(10) Patent No.: US 6,841,804 B1
(45) Date of Patent: Jan. 11, 2005

(54) DEVICE OF WHITE LIGHT-EMITTING DIODE

(75) Inventors: Lung-Chien Chen, Hsin-Chuang (TW); Feng-Ku Chien, Chung-Ho (TW); Wen-How Lan, Taoyuan (TW); Fen-Ren Chien, Yung-Ho (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 10/695,506

(22) Filed: Oct. 27, 2003

(51) Int. Cl.⁷ .............................................. H01L 29/227
(52) U.S. Cl. .......................... 257/98; 257/89; 257/103; 313/503
(58) Field of Search .............................. 257/98, 89, 99, 257/103; 313/503, 504

(56) References Cited

U.S. PATENT DOCUMENTS

| | | | |
|---|---|---|---|
| 6,466,135 B1 * | 10/2002 | Srivastava et al. | 340/815.4 |
| 6,469,322 B1 * | 10/2002 | Srivastava et al. | 257/89 |
| 6,505,948 B2 * | 1/2003 | Cekic et al. | 362/84 |
| 6,596,195 B2 * | 7/2003 | Srivastava et al. | 252/301.4 R |
| 6,791,259 B1 * | 9/2004 | Stokes et al. | 313/503 |
| 2002/0158565 A1 * | 10/2002 | Setlur et al. | 313/486 |

\* cited by examiner

Primary Examiner—Sara Crane

(57) ABSTRACT

A white LED device includes a member, a plurality of LEDs, fixed on the member, the LEDS further comprising blue GaN LEDs, a reflector, in parabolic shape, to encase thed member and the plurality of LEDs, yellow phosphor, coated on the surface of the reflector facing the LEDs, and a supporting component, for connecting the member and the reflector in order to connect the LEDs, the member and the reflector together. The main feature of the present invention includes that the LEDs emit blue light when positively biased. The blue light triggers yellow phosphor to generate a yellow light, and the blue light mixed with the yellow light to become a white light. The white light is reflected by the reflector to project onto target objects.

4 Claims, 6 Drawing Sheets

DEVICE OF WHITE LIGHT-EMITTING DIODE

FIELD OF THE INVENTION

The present invention relates to a device of white light-emitting diode (LED) and, more particularly, to a lighting device manufactured with GaN LEDs for emitting white light.

BACKGROUND OF THE INVENTION

Light-emitting diodes (LED) have been one of the most important inventions in the history of technological advancement. As widely known, an LED is a device that is able to emit light when a forward bias (voltage) is imposed on the semiconductor PN junction. he LEDs have the advantages of low energy-consumption, low heat-generation, high light-emitting stability, and long life-span, so that they are widely used in many industrial applications, such as an advertising billboard. The red, green, and blue LEDs are arranged in various shapes of arrays in an advertising billboard to display dynamic images. Because of their high efficiency and stability, LEDs are also widely used to replace conventional small light bulbs as indicators in equipment to display the operating status, such as ON, OFF, PAUSE, or STANDBY, and corresponding options to each status. LEDs are also used to manufacture lighting devices, such as torches, headlights for cars or bicycles. Furthermore, LEDs are also used as light source in communication, such as local-area network (LAN). With light emitted from the LEDS into its end, the multi-mode fiber optical is able to transmit the light inside it for a long distance.

Although the performance of LEDs in aforementioned applications is superior and stable, there exists some obstacles for overcoming. For example, when using red, green and blue LEDs in lighting devices, it is difficult to arrange and mixed the red, green and blue lights to generate the white light that is commonly used in lighting. As the related technology is still under development, the white light generated by current technologies are usually uneven, and sometimes mixed with lights of other colors. Therefore, the overall lighting effect needs improvement.

FIG. 1 shows a structure of a conventional white LED device, comprising a bell-shaped cover 1 made of epoxy for focusing light and protecting the internal components, such as LED 3, from external damages. The power for the LED is fed from the power line, through conducting line supports 4, to the electrodes 5. When the power is on, the LFD emits the light, which is focused and redirected by bell-shaped cover 1, serving as a convex lens. The light then travels straight forwards.

However, the white light generated by the aforementioned technology is usually uneven, and forms a beam that appears yellowish on the side, and bluish at the center. It is because conventional LED device are manufactured by directly applying yellow phosphor on blue LEDs, so that the generated white light is uneven. Furthermore, as the heat generated by the blue LED damages the yellow phosphor, the life span of the device is shortened. These are known disadvantages and restrictions of the convention LED devices.

The inventor of the present invention, based on years of experience and research, provides the present invention to solve the aforementioned obstacles.

SUMMARY OF THE INVENTION

An object of the present invention is to provide a white LED device that, unlike the conventional technologies, generates an even beam of white light.

In general there are three different approaches to manufacture white LED devices. The first approach is to use red, green, and blue LEDs to generate a white light. The second approach is to grow blue LEDs on a yellow substrate, such as a substrate made of ZnSe. The mixture of yellow light and blue light becomes the white light. The third approach is to apply a layer of yellow phosphor on the blue LEDs to result in a white light. The second and third approaches are the market mainstream because of its small size and flexible application. Particularly, the third approach uses the GaN material, which last longer than ZnSe substrate based LEDs, is more popular. Even so, the life span of white LED devices manufactured with the third approach is still short because the damage of the yellow phosphor by the heat generated by the LEDs. Therefore, the present invention uses a reflective approach to extend the life span of the LED device, as well as to reduce the manufacture cost. Even more important, the resulted device can generates an even white that avoids the yellow-blue beam generated by the conventional techniques.

Unlike conventional techniques, the reflective approach does not apply the yellow phosphor directly on the blue LEDs. Instead, a layer of the yellow phosphor is applied on the reflector, or alternatively, on a transparent film, which is then attached to the reflector, as the embodiments shown in FIGS. 2–4. When the blue light emitted from the blue LEDs is mixed with the yellow light generated by the yellow phosphor stimulated by the blue light, a white light is generated. Then, the reflector reflects the white light to light the area or object. As the yellow phosphor is not directly applied on the LEDs, it is not damaged by the heat generated by the LEDs.

These and other objects, features and advantages of the invention will be apparent to those skilled in the art, from a reading of the following brief description of the drawings, the detailed description of the preferred embodiment, and the appended claims.

DETAILED DESCRIPTION OF THE PREFERRED EMBODIMENTS

Figure 1:
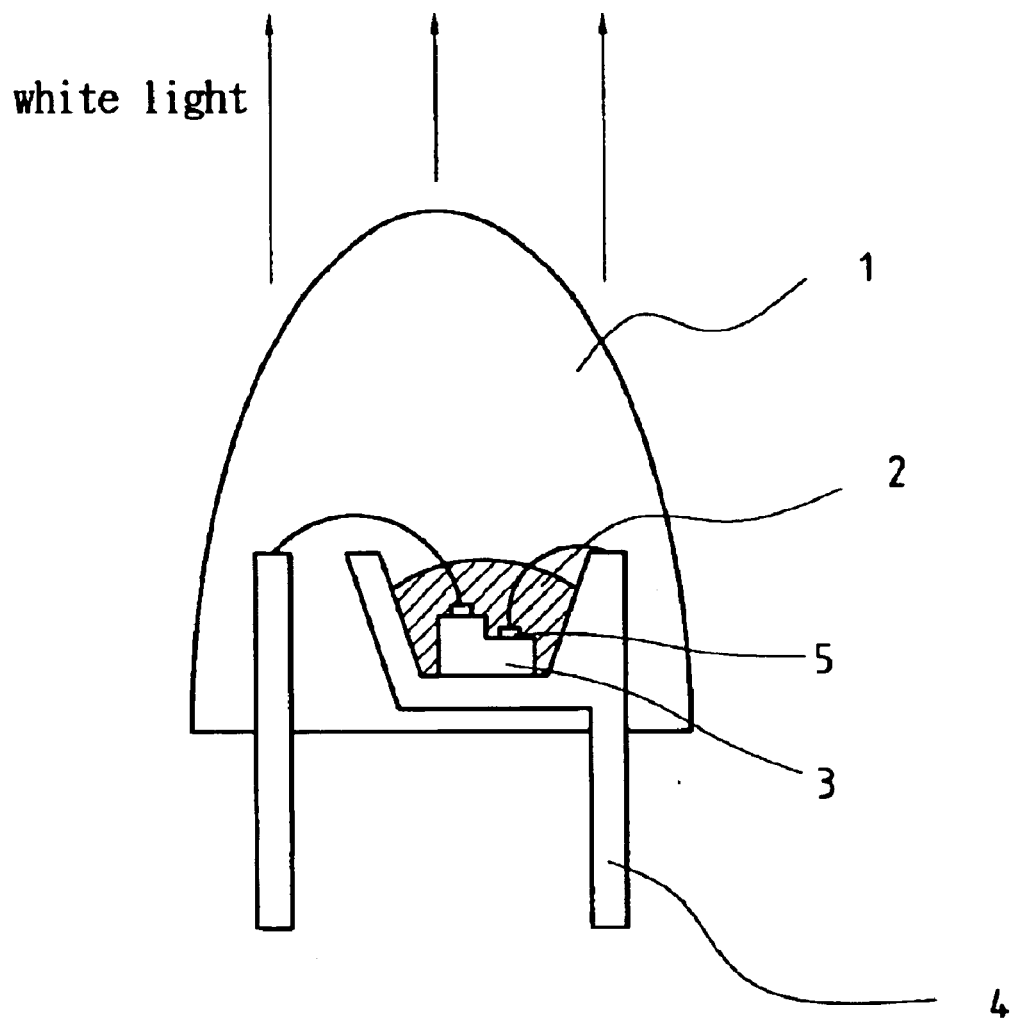
FIG. 1 shows a cross-sectional view of a conventional white LED device.
Figure 2:
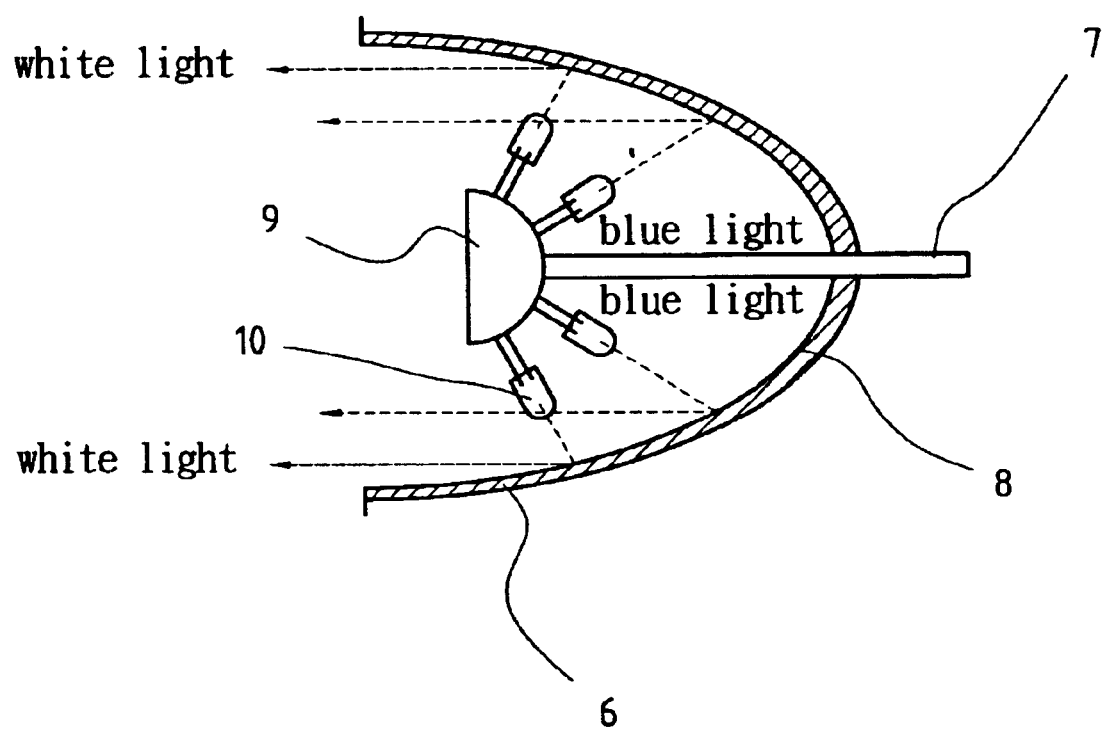
FIG. 2 shows a cross-sectional view of a first embodiment of a white LED device of present invention.

FIG. 2 shows a cross-sectional view of a first embodiment of a white LED device of present invention. The white LED device comprises a supporting component 7, connecting a reflector 6, and a member 9 with a plurality of LEDs 10. As shown in FIG. 9, LEDs 10 are fixed on member 9, and the yellow phosphor layer 8 is coated on reflector 6. The coating methods can be spin-coating, sputtering, printing, or other similar methods. The GaN blue LEDs are used in this embodiment. As shown in FIG. 2, the blue light emitted from GaN LEDs is mixed with the yellow light from phosphor when stimulated by the blue light to generate a white light. Reflector 6 reflects the mixed white light to the target surface, and lights up the target object.

The reflective approach used in the present invention is different from the that of a conventional white LED device. A conventional white LED device projects the light directly onto the target object, therefore, the mixed light is less even, and usually appears yellow-blue. On the other hand, the reflective approach used in the present invention reflects the mixed light with a reflector, and the reflected light is then projected onto the target object. Therefore, the present invention can effectively eliminate the uneven mixture of the light.

Figure 3:
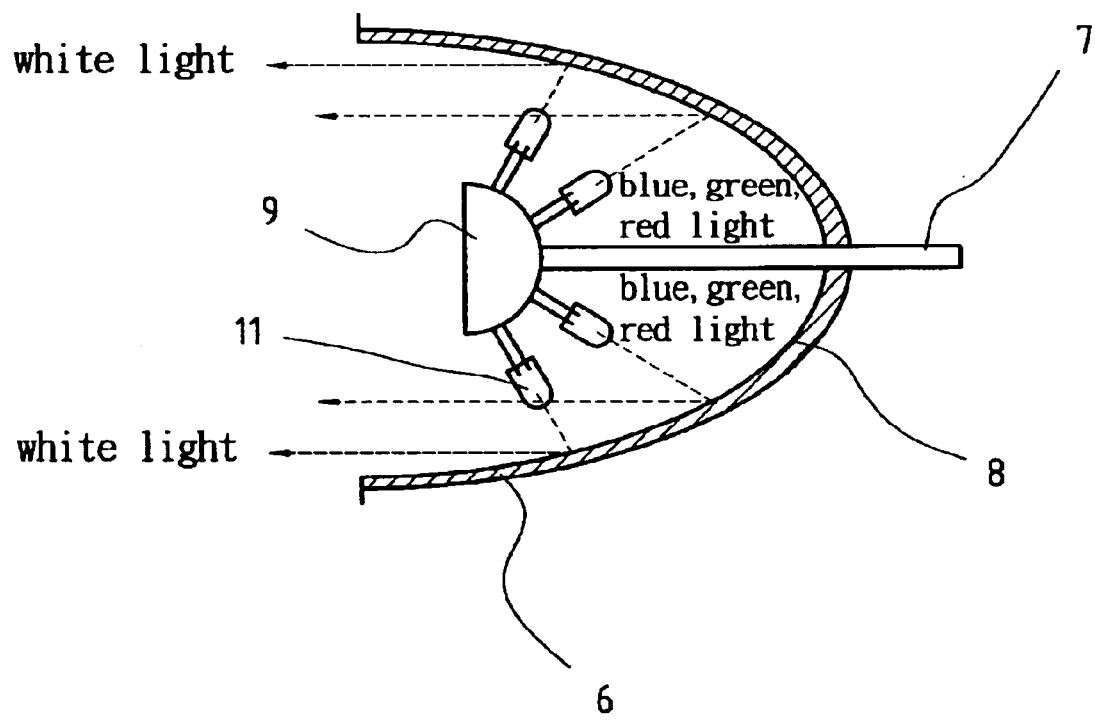
FIG. 3 shows a cross-sectional view of a second embodiment of a white LED device of present invention.

FIG. 3 shows a cross-sectional view of a second embodiment of a white LED device of present invention. The white LED device of the second embodiment is similar to that of the first embodiment shown in FIG. 2. The difference is that the blue GaN LEDs 11, green GaN LEDs 11, and red AlGaAs LEDs 11 are used in the second embodiment.

Figure 4:
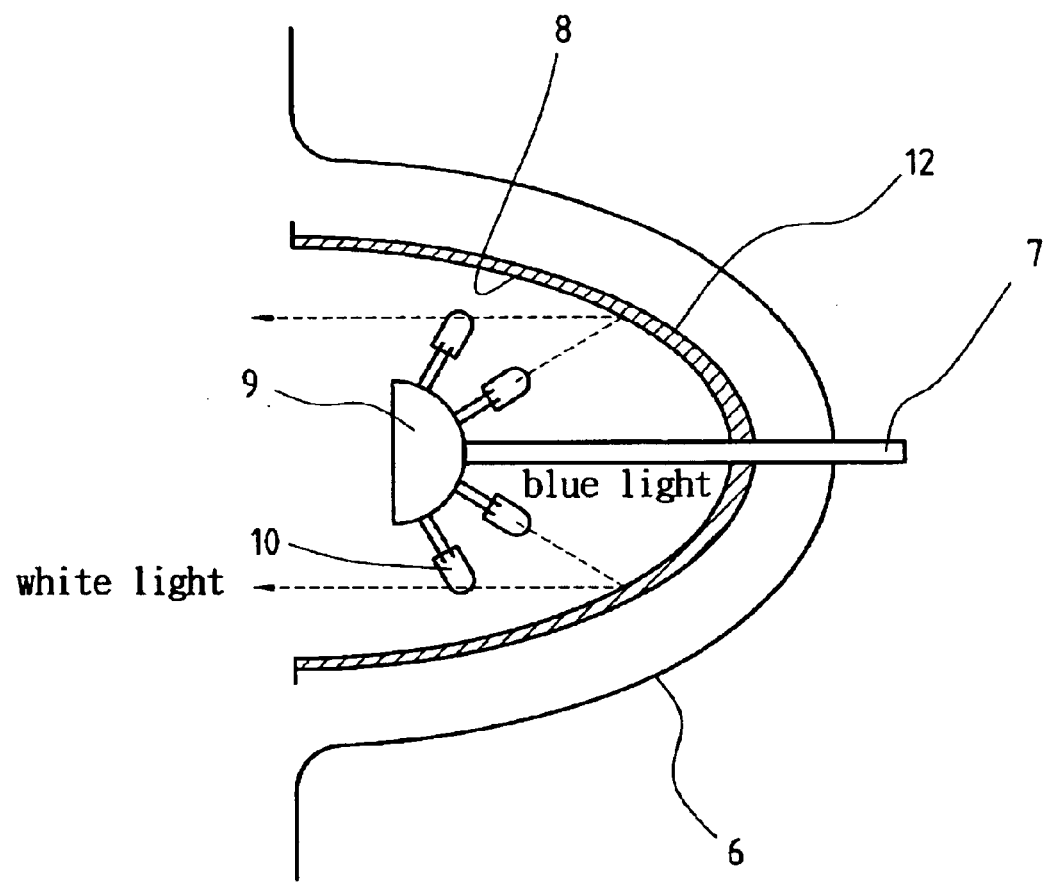
FIG. 4 shows a cross-sectional view of a third embodiment of a white LED device of present invention.

FIG. 4 shows a cross-sectional view of a third embodiment of a white LED device of present invention. The white LED device of the third embodiment is similar to that of the first embodiment shown in FIG. 2. The difference is that yellow phosphor 8 is directly coated on reflector 6 in the first embodiment, while yellow phosphor 8 is coated on a transparent film 12 in the third embodiment. Transparent film 12 is then attached to reflector 6 to achieve the same effect as in previous embodiments.

Figure 5:
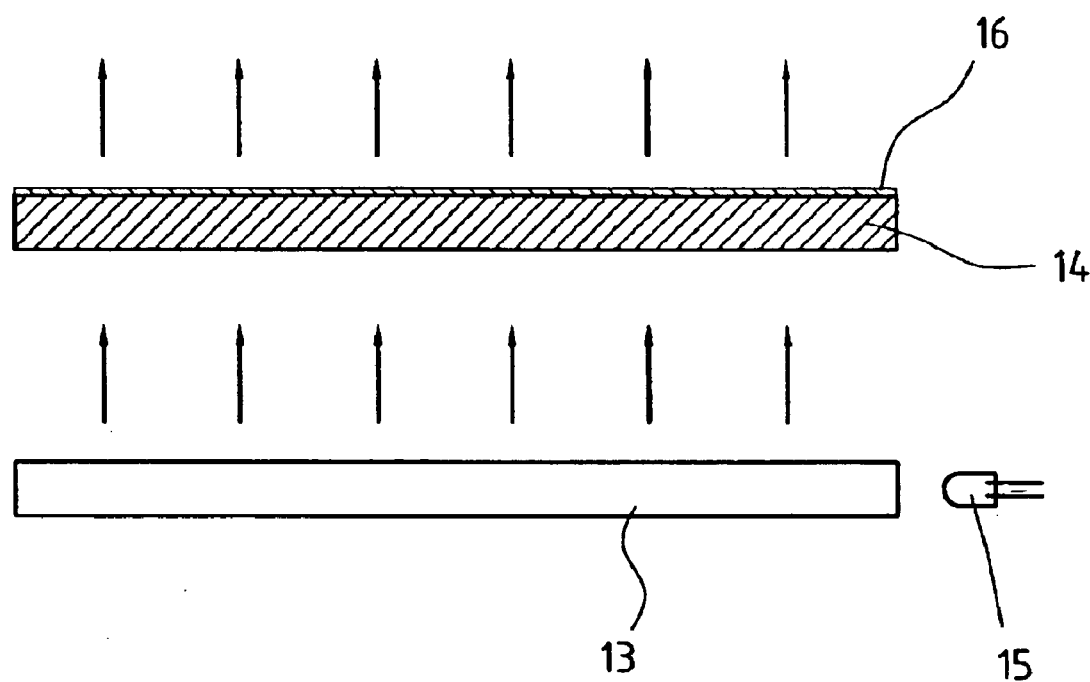
FIG. 5 shows a schematic view of another embodiment of a white LED device of present invention, where a transparent film with phosphor is attached to a blue light conducting board.

FIG. 5 shows an embodiment of attaching the transparent film 14 coated with yellow phosphor 16 to a blue light-conducting board 13. This design separates the short life-span stimulated object (i.e., yellow phosphor 16) from the long life-span light source (i.e., blue LED 15), so that the decay of the former does not affect the life-span of the latter. This provides a variation of coating used in the reflective approach.

Figure 6:
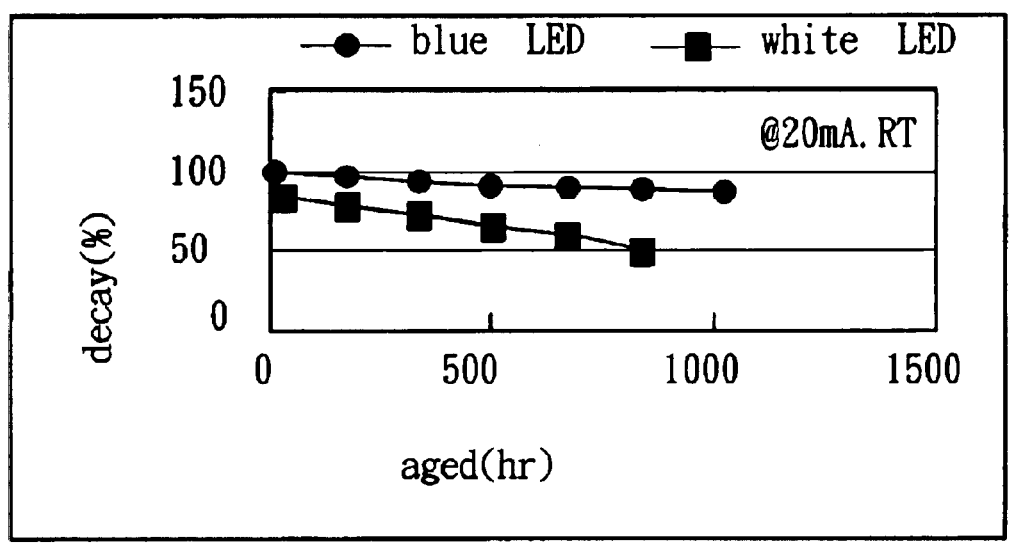
FIG. 6 shows the comparison of the light decay in embodiments using blue LEDs and white LEDs.

FIG. 6 shows the comparison of the light decay in embodiments using blue LEDs and white LEDs. FIG. 6 shows that the embodiment using blue LEDs suffers a smaller decay rate than the embodiment using white LEDs.

Another advantage of the present invention is that the design is modularized. The components, including reflector, LEDs, yellow phosphor, can be separately replaced when necessary without affecting the other components.

While the invention has been described in connection with what is presently considered to the most practical and preferred embodiment, it is to be understood that the invention is not to be limited to the disclosed embodiment, but, on the contrary, it should be clear to those skilled in the art that the description of the embodiment is intended to cover various modifications and equivalent arrangement included within the spirit and scope of the appended claims.

What is claimed is:

1. A white LED device, comprising:
   a member,
   a plurality of LEDs, fixed on the member, the LEDs further comprising blue GaN LEDs,
   a reflector, in parabolic shape, to encase the member and the plurality of LEDs,
   yellow phosphor, coated on the surface of the reflector facing the LEDs, and
   a supporting component, for connecting the member and the reflector in order to connect the LEDs, the member and the reflector together,
   wherein the LEDs emit blue light when positively biased, the blue light stimulating the yellow phosphor to generate yellow light, the blue light mixed with the yellow light to become a white light, the white light reflected by the reflector to project onto target objects.

2. The device as claimed in claim 1, wherein the LEDs further comprises blue GaN LEDs, green GaN LEDs, and red AlGaAs LEDs.

3. The device as claimed in claim 1, wherein the yellow phosphor is coated on a transparent film attached to the reflector.

4. The device as claimed in claim 1, wherein the reflector is coated with the yellow phosphor by spin-coating, sputtering, printing, or other similar methods.

* * * * *